United States Patent
Shao et al.

[11] Patent Number: 6,117,747
[45] Date of Patent: Sep. 12, 2000

[54] INTEGRATION OF MOM CAPACITOR INTO DUAL DAMASCENE PROCESS

[75] Inventors: Kai Shao; Yi Xu; Cerdin Lee; Shao-Fu Sanford Chu, all of Singapore, Singapore

[73] Assignee: Chartered Semiconductor Manufacturing Ltd., Singapore, Singapore

[21] Appl. No.: 09/435,436

[22] Filed: Nov. 22, 1999

[51] Int. Cl.[7] .................................................. H01L 21/20
[52] U.S. Cl. ........................................................... 438/396
[58] Field of Search ................................... 438/396, 395, 438/288, 250, 397, 386, 253

[56] References Cited

U.S. PATENT DOCUMENTS

| | | | |
|---|---|---|---|
| 5,406,447 | 4/1995 | Miyazaki | 301/313 |
| 5,479,316 | 12/1995 | Smrtic et al. | 361/322 |
| 5,736,448 | 4/1998 | Saia et al. | 438/393 |
| 5,812,364 | 9/1998 | Oku et al. | 361/312 |
| 5,813,664 | 9/1998 | Pan | 257/303 |
| 5,946,567 | 8/1999 | Weng et al. | 438/250 |

*Primary Examiner*—Charles Bowers
*Assistant Examiner*—Craig Thompson
*Attorney, Agent, or Firm*—George O. Saile; Rosemary L. S. Pike

[57] ABSTRACT

A method for fabricating a metal-oxide-metal capacitor using a dual damascene process is described. A dielectric layer is provided overlying a semiconductor substrate. A dual damascene opening in the dielectric layer is filled with copper to form a copper via underlying a copper line. A first metal layer is deposited overlying the copper line and patterned to form a bottom capacitor plate contacting the copper line. A capacitor dielectric layer is deposited overlying the bottom capacitor plate. A second metal layer is deposited overlying the capacitor dielectric layer and patterned to form a top capacitor plate to complete fabrication of a metal-oxide-metal capacitor.

20 Claims, 4 Drawing Sheets

6,117,747

INTEGRATION OF MOM CAPACITOR INTO DUAL DAMASCENE PROCESS

BACKGROUND OF THE INVENTION (1) Field of the Invention

The present invention relates to a method of fabricating a metal-oxide-metal capacitor, and more particularly, to a method of integrating the formation of a metal-oxide-metal capacitor into the dual damascene process in the fabrication of an integrated circuit device.

(2) Description of the Art

Capacitors are critical components in the integrated circuit devices of today. Both polysilicon and metal-oxide-metal capacitors have been used in the art. Metal-oxide-metal (MOM) capacitors have been increasing in popularity because their minimal capacitive loss to the substrate results in a high quality capacitor. It is desired to integrate the MOM capacitor with the dual copper damascene process, for example, in RF/Mixed signal applications where the capacitor is to be used as a decoupler or filter. The major concerns involved in integrating the MOM capacitor in the dual damascene process include: a) dishing effect if the metal width is too great and b) area capacitor size is limited by the metal line.

U.S. Pat. No. 5,813,664 to Pan teaches a process where the bottom capacitor plate and bond pads are formed at the same time. U.S. Pat. No. 5,736,448 to Saia et al show a MOM capacitor on an upper level. U.S. Pat. No. 5,479,316 to Smrtic et al, U.S. Pat. No. 5,812,364 to Oku et al, and U.S. Pat. No. 5,406,447 to Miyazaki all disclose various methods of forming metal-oxide-metal capacitors.

SUMMARY OF THE INVENTION

Accordingly, it is a primary object of the invention to provide an effective and very manufacturable process for fabricating a metal-oxide-metal capacitor using a dual damascene process.

Another object of the present invention is to provide a method for fabricating a metal-oxide-metal capacitor using a dual damascene process wherein an additional thin metal layer forms the bottom capacitor plate.

In accordance with the objects of this invention, a method for fabricating a metal-oxide-metal capacitor using a dual damascene process is achieved. A dielectric layer is provided overlying a semiconductor substrate. A dual damascene opening in the dielectric layer is filled with copper to form a copper via underlying a copper line. A first metal layer is deposited overlying the copper line and patterned to form a bottom capacitor plate contacting the copper line. A capacitor dielectric layer is deposited overlying the bottom capacitor plate. A second metal layer is deposited overlying the capacitor dielectric layer and patterned to form a top capacitor plate to complete fabrication of a metal-oxide-metal capacitor.

BRIEF DESCRIPTION OF THE DRAWINGS

In the following drawings forming a material part of this description, there is shown.

DESCRIPTION OF THE PREFERRED EMBODIMENTS

The process of the present invention integrates formation of a MOM capacitor with a dual damascene process while avoiding the problem of dishing. In this process, the capacitor size is not limited by the metal line.

Figure 1:
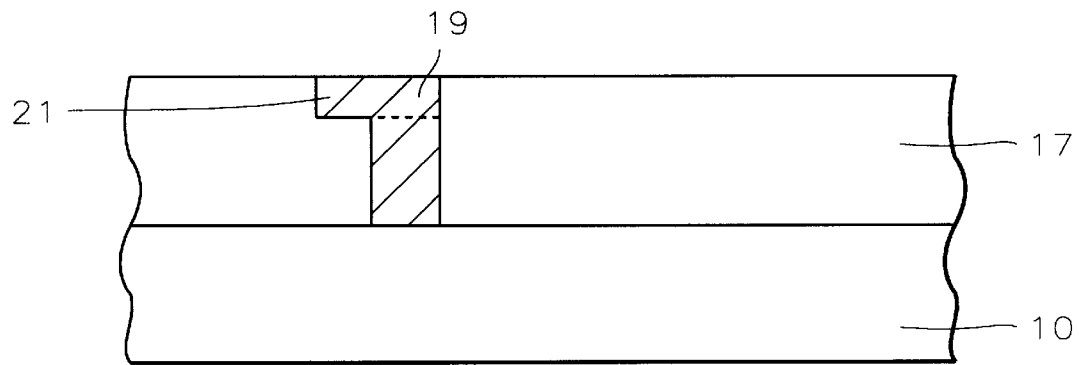
FIGS. 1 and 2 are schematic cross-sectional representations illustrating problems in the prior art.
Figure 2:
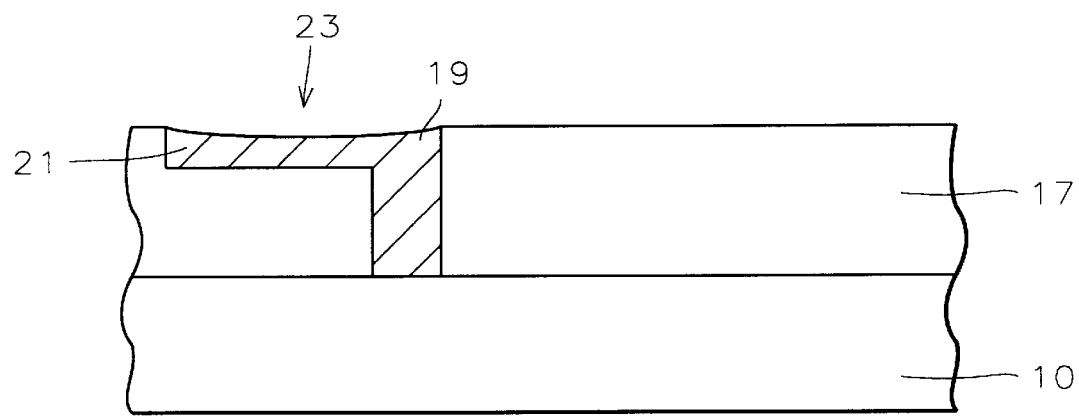

FIGS. 1 and 2 illustrate the problems involved in using a dual damascene method to form a MOM capacitor. As shown in FIG. 1, a dual damascene opening has been formed in a dielectric layer 17 on a semiconductor substrate 10. The opening is filled with copper 19. The horizontal portion 21 will form the bottom capacitor plate. However, the width of the capacitor plate 21 must be increased to increase capacitance. If the width of the upper portion of the dual damascene opening is increased, as shown in FIG. 2, dishing 23 will occur after polishing of the copper layer 21.

Figure 3:
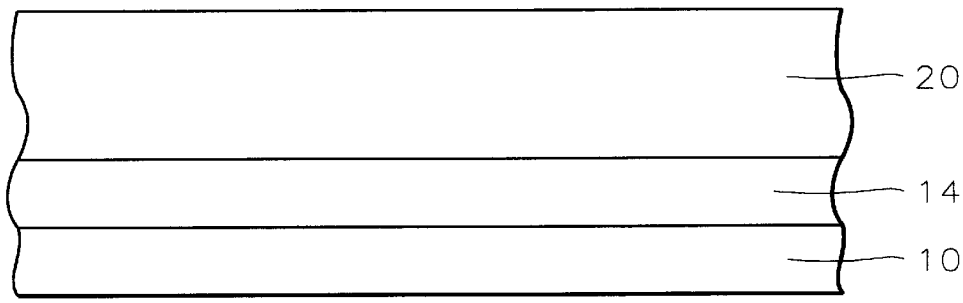
FIGS. 3 through 10 are schematic cross-sectional representations of a preferred embodiment of the present invention.

The process of the present invention to avoid these problems will now be described with reference to FIGS. 3–10. Referring now more particularly to FIG. 3, there is shown a partially completed integrated circuit device. The semiconductor substrate 10 is preferably composed of silicon having a (100) crystallographic orientation. Semiconductor device structures are formed in and on the semiconductor substrate. These may include gate electrodes and interconnection lines and associated source and drain regions and lower levels of metallization. The semiconductor device structures, not shown, may be formed in layer 14 and covered with an insulating layer.

Now, a dielectric layer 20 is formed over the layer 14. This may be a multi-layer of alternating dielectric and etch stop layers, depending upon the particular method to be used to form the dual damascene opening. Typical dielectric materials include tetraethoxysilane (TEOS) oxide, fluorinated silicate glass (FSG), or other low dielectric constant materials. The total thickness of the layer 20 is between about 10,000 and 20,000 Angstroms.

Figure 4:
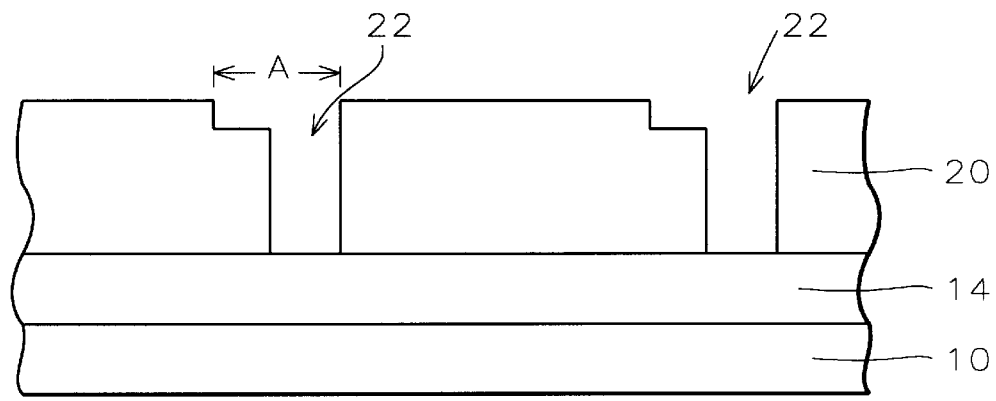

As shown in FIG. 4, dual damascene openings 22 are formed using one of the conventional dual damascene processes, such as trench first, via first, or trench through. The dual damascene openings 22 have a conventional upper width A of between about 3000 and 10,000 Angstroms, as the width shown in FIG. 1 of the prior art. Because of this small width, dishing will not be a problem.

Figure 5:
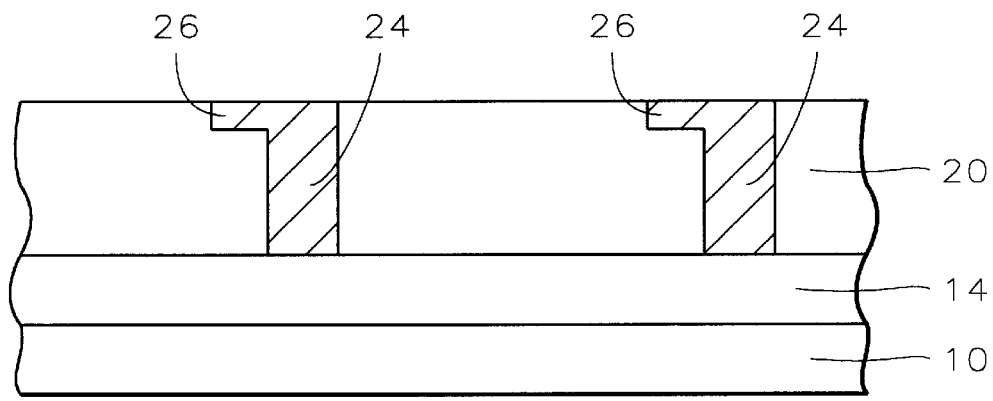

The dual damascene openings are filled with copper using, for example, a copper seed layer and electroless plating, electrochemical plating, or copper deposition, or the like. If necessary, excess copper is polished back, using, for example, chemical mechanical polishing. Because the width A is not too wide, dishing (as shown in FIG. 2) does not occur. The completed copper damascene regions 24/26 are shown in FIG. 5. 24 is the via portion and 26 is the metal line portion of the copper regions.

Figure 6:
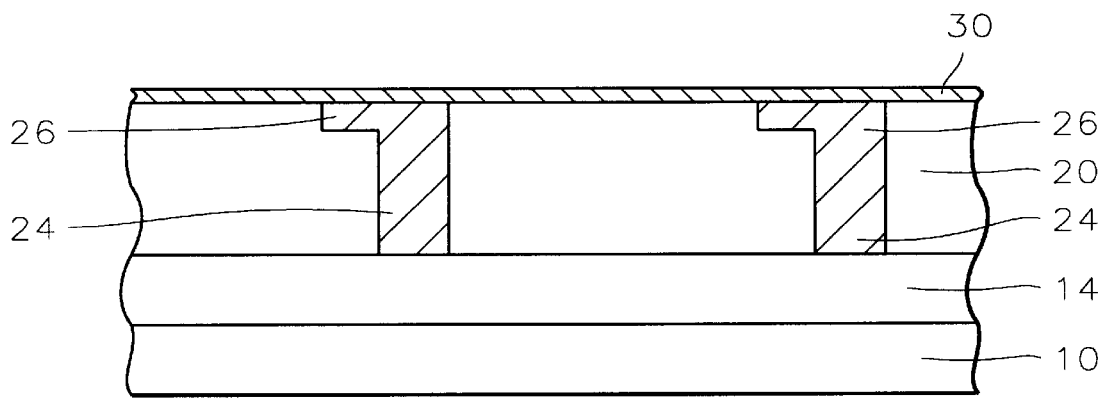

Now, the key feature of the present invention will be described. The metal line portion 26 of the copper damascene region is not wide enough to form a high quality bottom capacitor plate. Therefore, an additional thin metal layer 30 is deposited over the metal lines 26 and the dielectric layer 20, as shown in FIG. 6. The metal layer 30 may comprise tantalum nitride or titanium nitride or any other metal. The metal layer 30 is deposited by physical vapor deposition or chemical vapor deposition to a thickness of between about 1000 and 3000 Angstroms.

Figure 7:
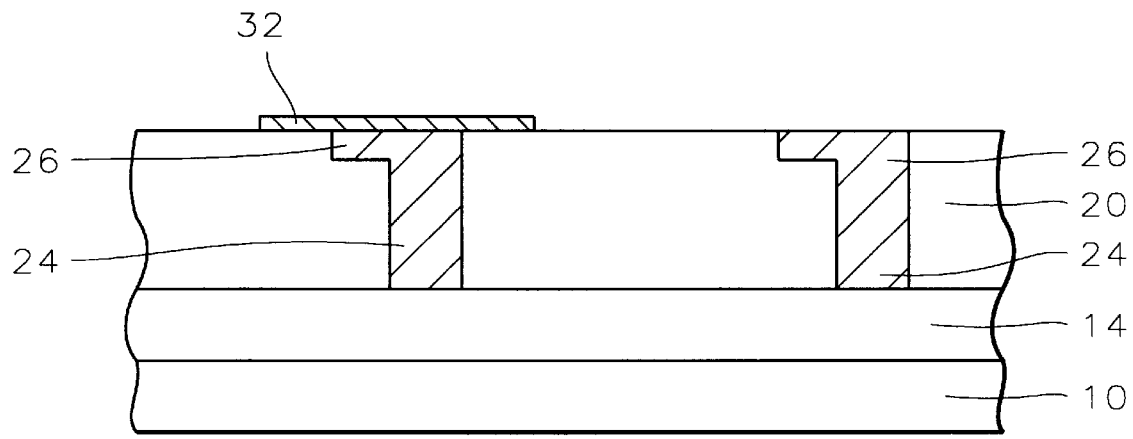

Now, the metal layer 30 is patterned using conventional lithographic and etching techniques to form the bottom capacitor plate 32 contacting one of the copper lines 26, as shown in FIG. 7. The bottom plate 32 can be formed in any size needed. Thus, the capacitor size is not limited by the size of the copper line bottom contact 26.

Figure 8:
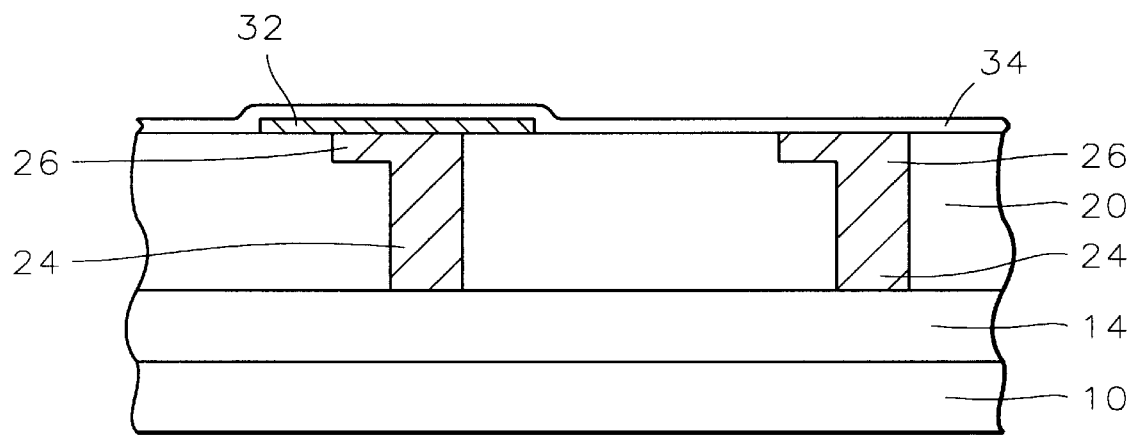

Referring now to FIG. 8, a capacitor dielectric layer 34 is deposited over the bottom capacitor plate 32. The capacitor dielectric may comprises silicon nitride, silicon oxynitride, ONO (oxide/nitride/oxide), NO (nitride/oxide), or any other suitable dielectric. The thickness of the capacitor dielectric layer 34 is typically between about 500 and 2000 Angstroms.

Figure 9:
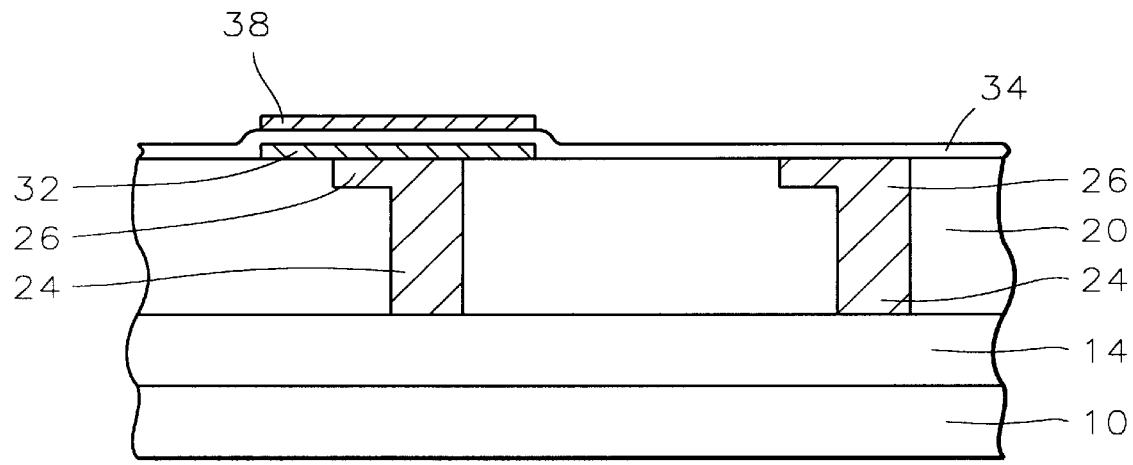

Next, as shown in FIG. 9, a second metal layer is deposited over the capacitor dielectric layer and patterned to form the top capacitor plate 38. The second metal layer may comprise tantalum nitride or any other suitable metal and have a thickness of between about 1000 and 3000 Angstroms.

Figure 10:
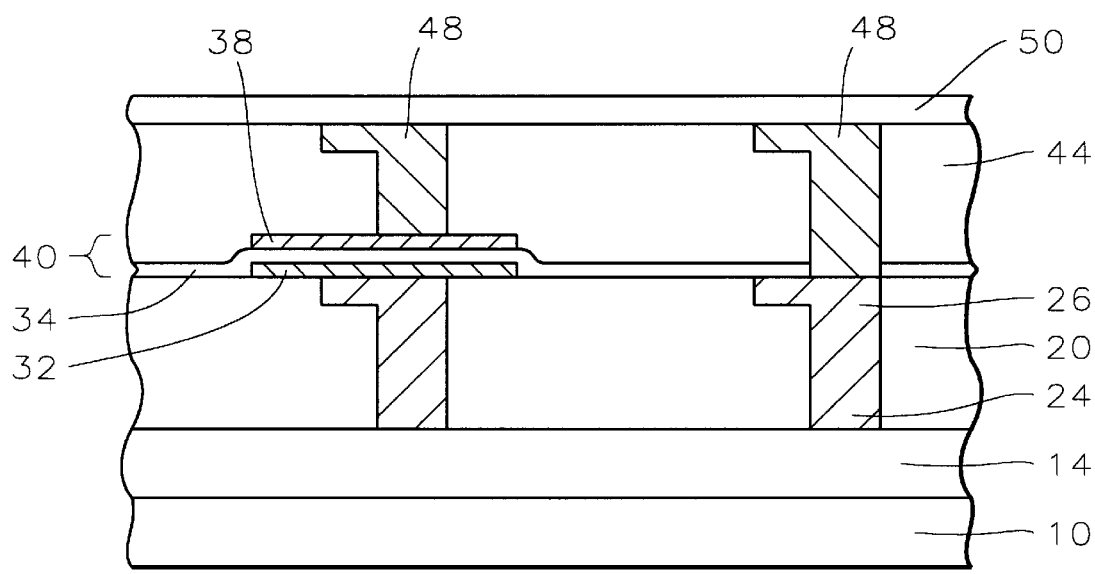

This completes the MOM capacitor 40, shown in FIG. 10. Now, a second dielectric layer 44 is deposited over the capacitor 40 and capacitor dielectric 34. Again, this layer 44 may comprise multiple layers. Dual damascene openings may be formed in this dielectric layer and filled with copper 48, as shown. If this is the topmost metal layer, a passivation layer 50 completes the integrated circuit.

In the example illustrated, the MOM capacitor is formed in the second to topmost layer in order to prevent capacitive loss to the substrate. It will be understood by those skilled in the art, however, that the MOM capacitor may be fabricated according to the process of the invention in any of the metal layers.

The process of the invention results in the fabrication of a metal-oxide-metal capacitor using a dual damascene process. Dishing does not occur since the dual damascene opening is kept narrow enough. The additional thin metal layer provides the increased width of the bottom capacitor plate required to increase capacitance without increasing the width of the dual damascene opening.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a metal-oxide-metal capacitor comprising:

providing a dielectric layer overlying a semiconductor substrate;

filling a dual damascene opening within said dielectric layer with copper to form a copper via underlying a copper line;

depositing a first metal layer overlying said copper line;

patterning said first metal layer to form a bottom capacitor plate contacting said copper line;

depositing a capacitor dielectric layer overlying said bottom capacitor plate; and depositing a second metal layer overlying said capacitor dielectric layer and patterning said second metal layer to form a top capacitor plate to complete said fabrication of said metal-oxide-metal capacitor.

2. The method according to claim 1 wherein said semiconductor substrate includes semiconductor device structures such as gate electrodes and source and drain regions.

3. The method according to claim 1 wherein said semiconductor substrate includes semiconductor device structures such as gate electrodes and source and drain regions and multiple levels of metal interconnections.

4. The method according to claim 1 wherein said first metal layer comprises tantalum nitride.

5. The method according to claim 1 wherein said first metal layer comprises titanium nitride.

6. The method according to claim 1 wherein said capacitor dielectric layer comprises silicon nitride having a thickness of between about 500 and 2000 Angstroms.

7. The method according to claim 1 wherein said capacitor dielectric layer comprises silicon oxynitride having a thickness of between about 500 and 2000 Angstroms.

8. The method according to claim 1 wherein said second metal layer comprises tantalum nitride.

9. A method for fabricating a metal-oxide-metal capacitor comprising:

providing a dielectric layer overlying a semiconductor substrate;

filling a dual damascene opening within said dielectric layer with copper to form a copper via underlying a copper line;

depositing a first tantalum nitride layer overlying said copper line;

patterning said first tantalum nitride layer to form a bottom capacitor plate contacting said copper line;

depositing a capacitor dielectric layer overlying said bottom capacitor plate; and depositing a second tantalum nitride layer overlying said capacitor dielectric layer and patterning said second tantalum nitride layer to form a top capacitor plate to complete said fabrication of said metal-oxide-metal capacitor.

10. The method according to claim 9 wherein said semiconductor substrate includes semiconductor device structures such as gate electrodes and source and drain regions.

11. The method according to claim 9 wherein said semiconductor substrate includes semiconductor device structures such as gate electrodes and source and drain regions and multiple levels of metal interconnections.

12. The method according to claim 9 wherein said capacitor dielectric layer comprises silicon nitride having a thickness of between about 500 and 2000 Angstroms.

13. The method according to claim 9 wherein said capacitor dielectric layer comprises silicon oxynitride having a thickness of between about 500 and 2000 Angstroms.

14. A method for fabricating a metal-oxide-metal capacitor in the fabrication of an integrated circuit comprising:

providing a first dielectric layer overlying a semiconductor substrate;

filling a dual damascene opening within said first dielectric layer with copper to form a copper via underlying a copper line;

depositing a first metal layer overlying said copper line;

patterning said first metal layer to form a bottom capacitor plate contacting said copper line;

depositing a capacitor dielectric layer overlying said bottom capacitor plate;

depositing a second metal layer overlying said capacitor dielectric layer and patterning said second metal layer to form a top capacitor plate to complete said fabrication of said metal-oxide-metal capacitor;

depositing a second dielectric layer over said metal-oxide-metal capacitor;

forming a dual damascene opening in said second dielectric layer to contact said top capacitor plate and filling said dual damascene opening with copper; and depositing a passivation layer over said second dielectric layer to complete fabrication of said integrated circuit.

15. The method according to claim 14 wherein said semiconductor substrate includes semiconductor device structures such as gate electrodes and source and drain regions.

16. The method according to claim 14 wherein said semiconductor substrate includes semiconductor device structures such as gate electrodes and source and drain regions and multiple levels of metal interconnections.

17. The method according to claim 14 wherein said first metal layer comprises one of the group containing tantalum nitride and titanium nitride.

18. The method according to claim 14 wherein said capacitor dielectric layer comprises silicon nitride having a thickness of between about 500 and 2000 Angstroms.

19. The method according to claim 14 wherein said capacitor dielectric layer comprises silicon oxynitride having a thickness of between about 500 and 2000 Angstroms.

20. The method according to claim 14 wherein said second metal layer comprises tantalum nitride.

* * * * *